(12) United States Patent
Semmler

(10) Patent No.: US 7,346,885 B2
(45) Date of Patent: Mar. 18, 2008

(54) METHOD FOR PRODUCING A MASK LAYOUT AVOIDING IMAGING ERRORS FOR A MASK

(75) Inventor: Armin Semmler, Munich (DE)

(73) Assignee: Qimonda AG, Munich (DE)

( * ) Notice: Subject to any disclaimer, the term of this patent is extended or adjusted under 35 U.S.C. 154(b) by 17 days.

(21) Appl. No.: 11/233,927

(22) Filed: Sep. 23, 2005

(65) Prior Publication Data
US 2006/0070018 A1     Mar. 30, 2006

(30) Foreign Application Priority Data
Sep. 24, 2004    (DE)    ...... 10 2004 047 263

(51) Int. Cl.
*G06F 17/50*    (2006.01)

(52) U.S. Cl. ................................ 716/19

(58) Field of Classification Search .......... 716/19, 716/21; 430/5
See application file for complete search history.

(56) References Cited

U.S. PATENT DOCUMENTS

| | | |
|---|---|---|
| 5,242,770 A | 9/1993 | Chen et al. |
| 5,821,014 A | 10/1998 | Chen et al. |
| 6,077,310 A | 6/2000 | Yamamoto et al. |
| 6,114,071 A | 9/2000 | Chen et al. |
| 6,421,820 B1 | 7/2002 | Mansfield et al. |
| 2002/0091985 A1 | 7/2002 | Liebmann et al. |
| 2002/0182523 A1* | 12/2002 | Frankowsky ........... 430/30 |
| 2002/0192570 A1 | 12/2002 | Smith |
| 2004/0023132 A1 | 2/2004 | Akiyama |
| 2004/0139418 A1* | 7/2004 | Shi et al. ................ 716/19 |
| 2004/0166418 A1* | 8/2004 | Samuels ................. 430/5 |
| 2004/0248016 A1 | 12/2004 | Lucas et al. |
| 2004/0256356 A1 | 12/2004 | Bauch et al. |
| 2005/0044513 A1* | 2/2005 | Robles et al. ........... 716/4 |

(Continued)

FOREIGN PATENT DOCUMENTS

DE    101 33 127 C2    6/2003

(Continued)

OTHER PUBLICATIONS

Fischer, W., et al., "Simulation-based Proximity Correction in High-Volume DRAM Production," Optical Microlithography XIII; Proceedings of SPIE, vol. 4000, 2000, pp. 1002-1009.

(Continued)

*Primary Examiner*—Paul Dinh
(74) *Attorney, Agent, or Firm*—Slater & Matsil, L.L.P.

(57) ABSTRACT

A final mask layout (20') is produced by producing a provisional auxiliary mask layout in accordance with a predefined electrical circuit diagram and converting it into the final mask layout (20') with the aid of an OPC method. Before carrying out the OPC method, with the provisional auxiliary mask layout (100), firstly a modified auxiliary mask layout (100') is formed by arranging at least one optically non-resolvable auxiliary structure (130) between two mask structures (110, 120) of the provisional auxiliary mask layout (100). The optically non-resolvable auxiliary structure (130) is positioned between the two mask structures (110, 120) in a manner dependent on the structure size (B1, B2) of the two mask structures, (110, 120). An eccentric offset (V) of the optically non-resolvable auxiliary structure (130) between the two mask structures is effected in the case of differing structure sizes (ΔB) of the two mask structures.

49 Claims, 13 Drawing Sheets

U.S. PATENT DOCUMENTS

2005/0202321 A1* 9/2005 Gordon et al. ............... 430/5
2006/0057475 A1* 3/2006 Liebmann et al. ........... 430/5
2006/0101370 A1* 5/2006 Cui et al. .................... 716/19
2006/0190919 A1* 8/2006 Zhang et al. ................ 716/21

FOREIGN PATENT DOCUMENTS

JP          06242594 A      9/1994

WO     WO 03/021353 A1    3/2003

OTHER PUBLICATIONS

Schellenberg, F., "A Little Light Magic," IEEE Spectrum, Sep. 2003, pp. 34-39.

* cited by examiner

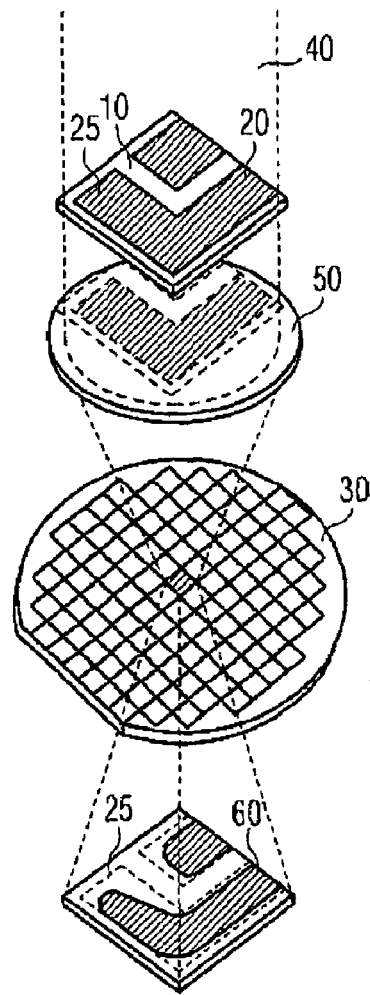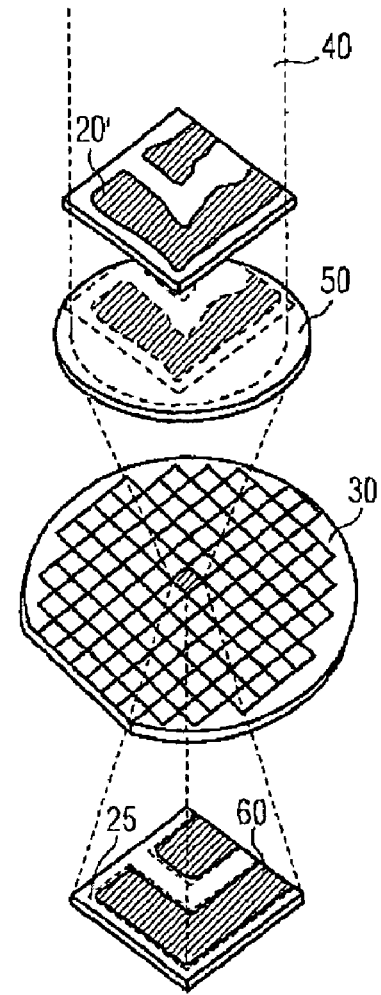

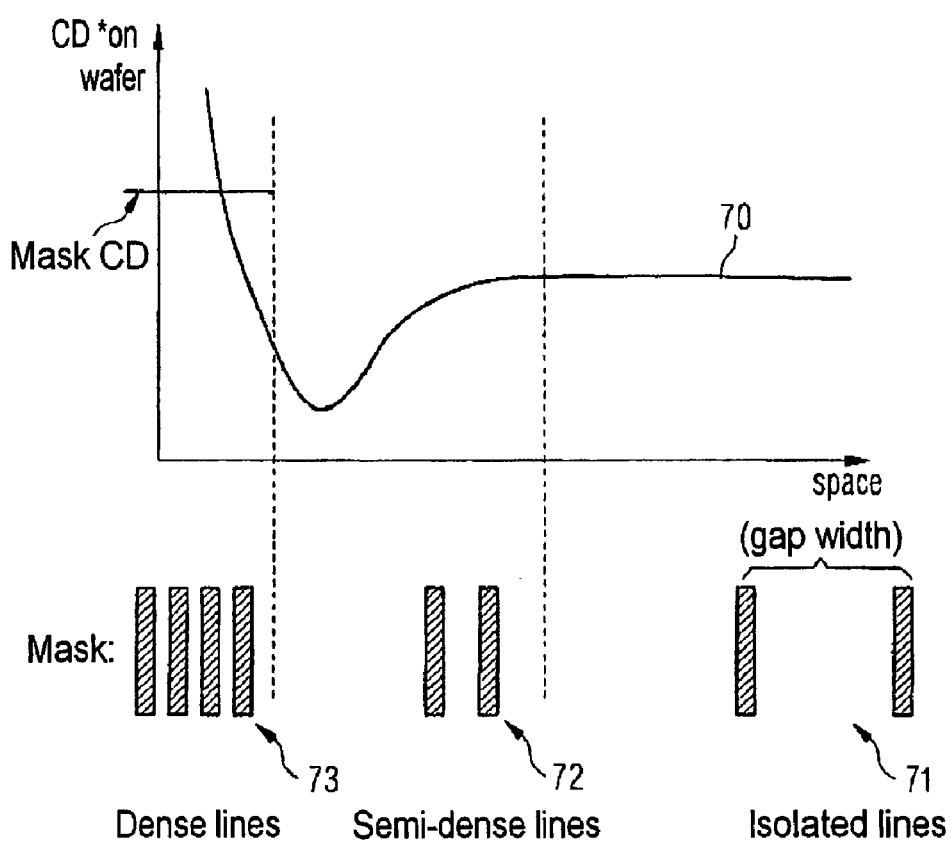

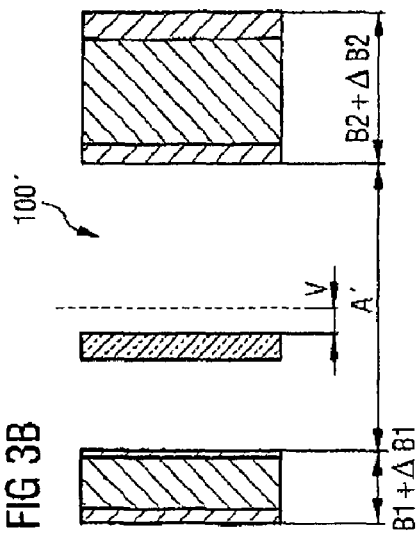
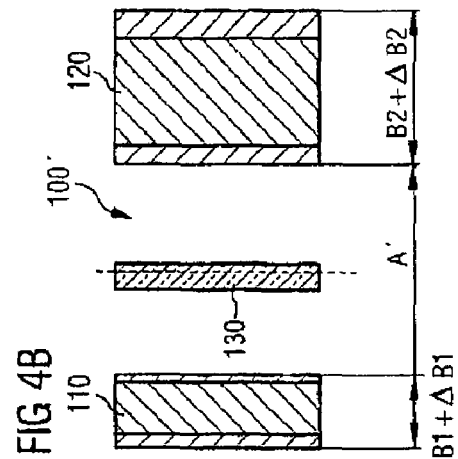
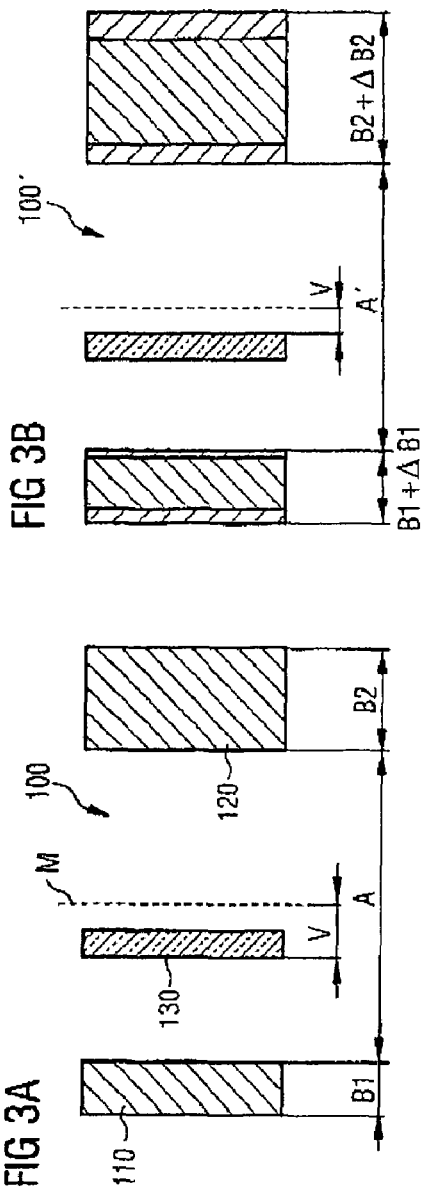
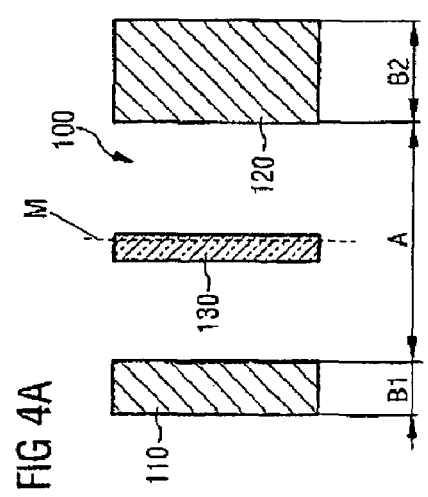

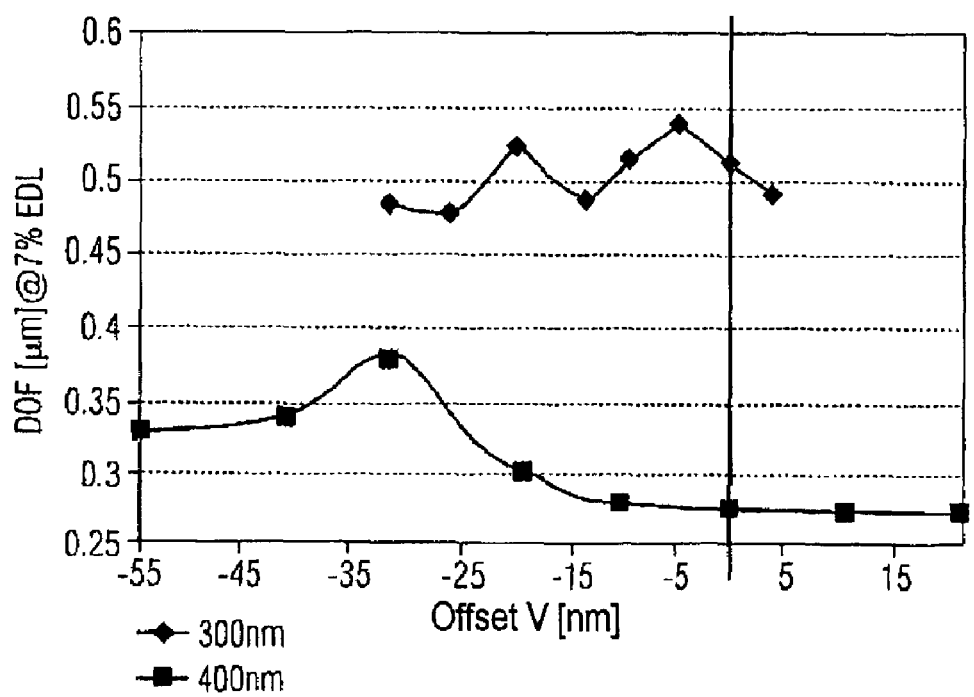
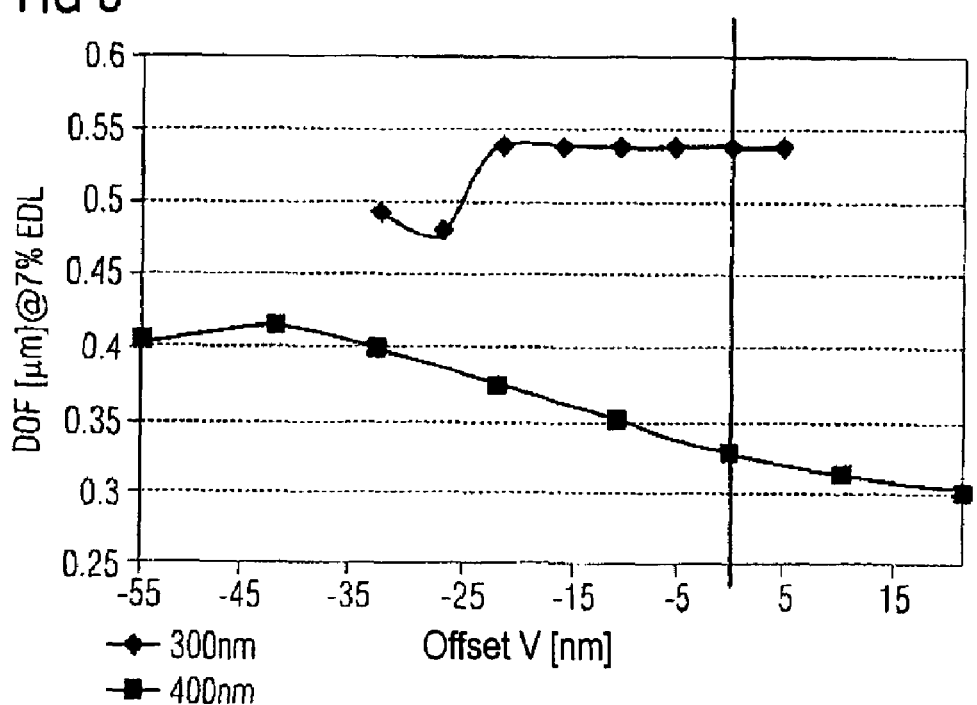

FIG 7
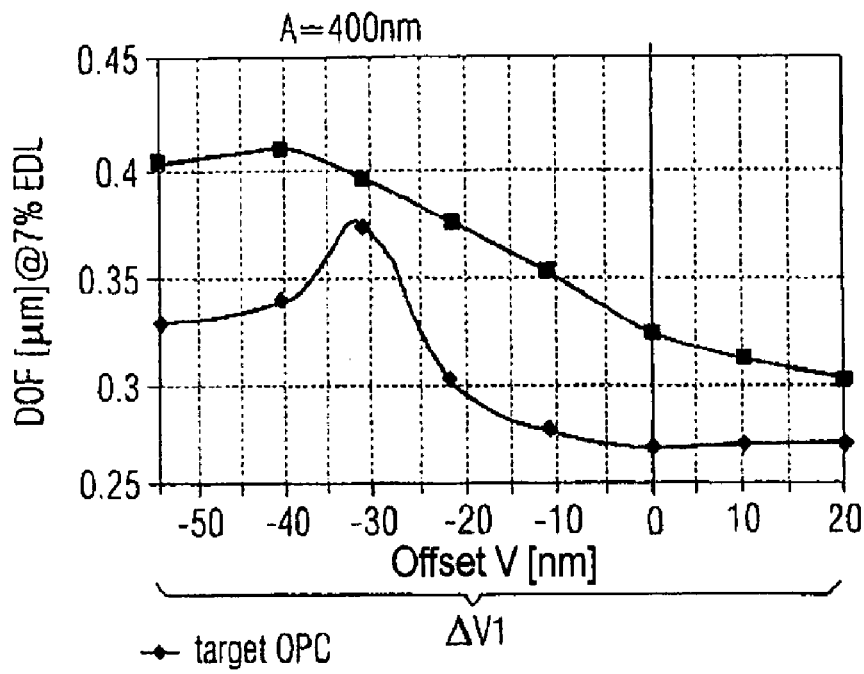
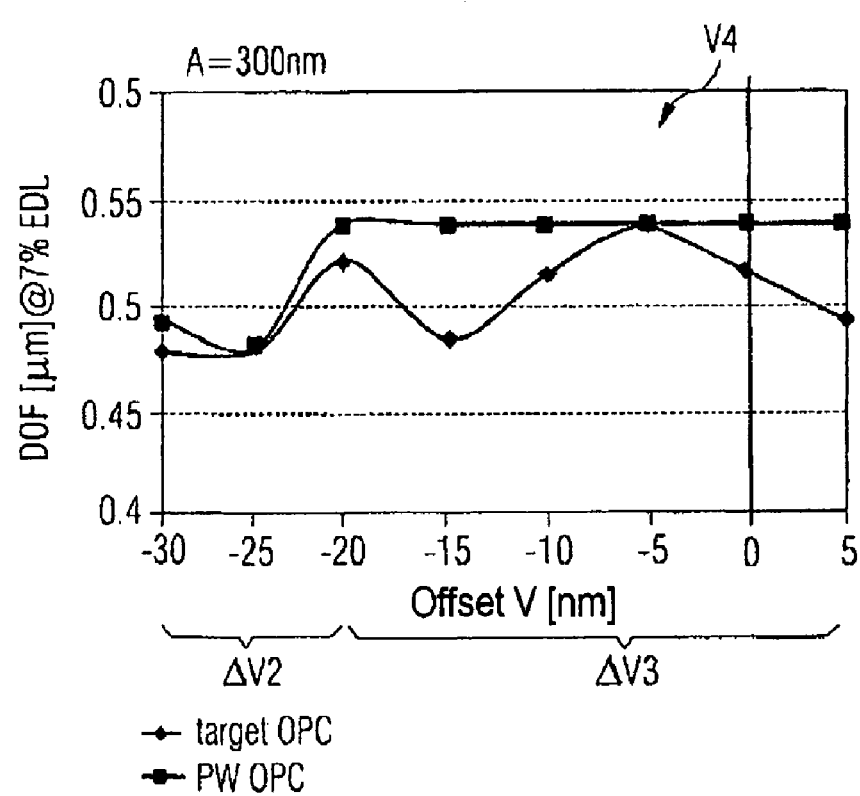

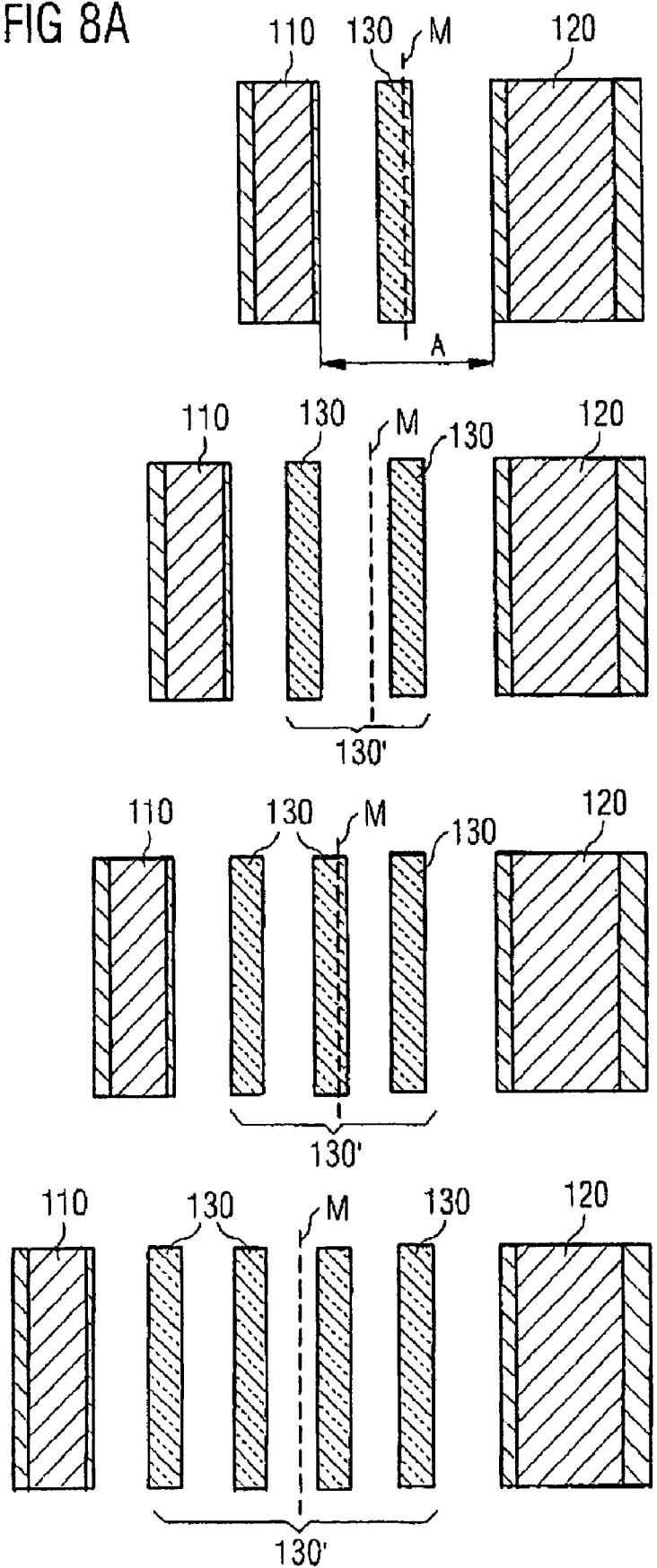

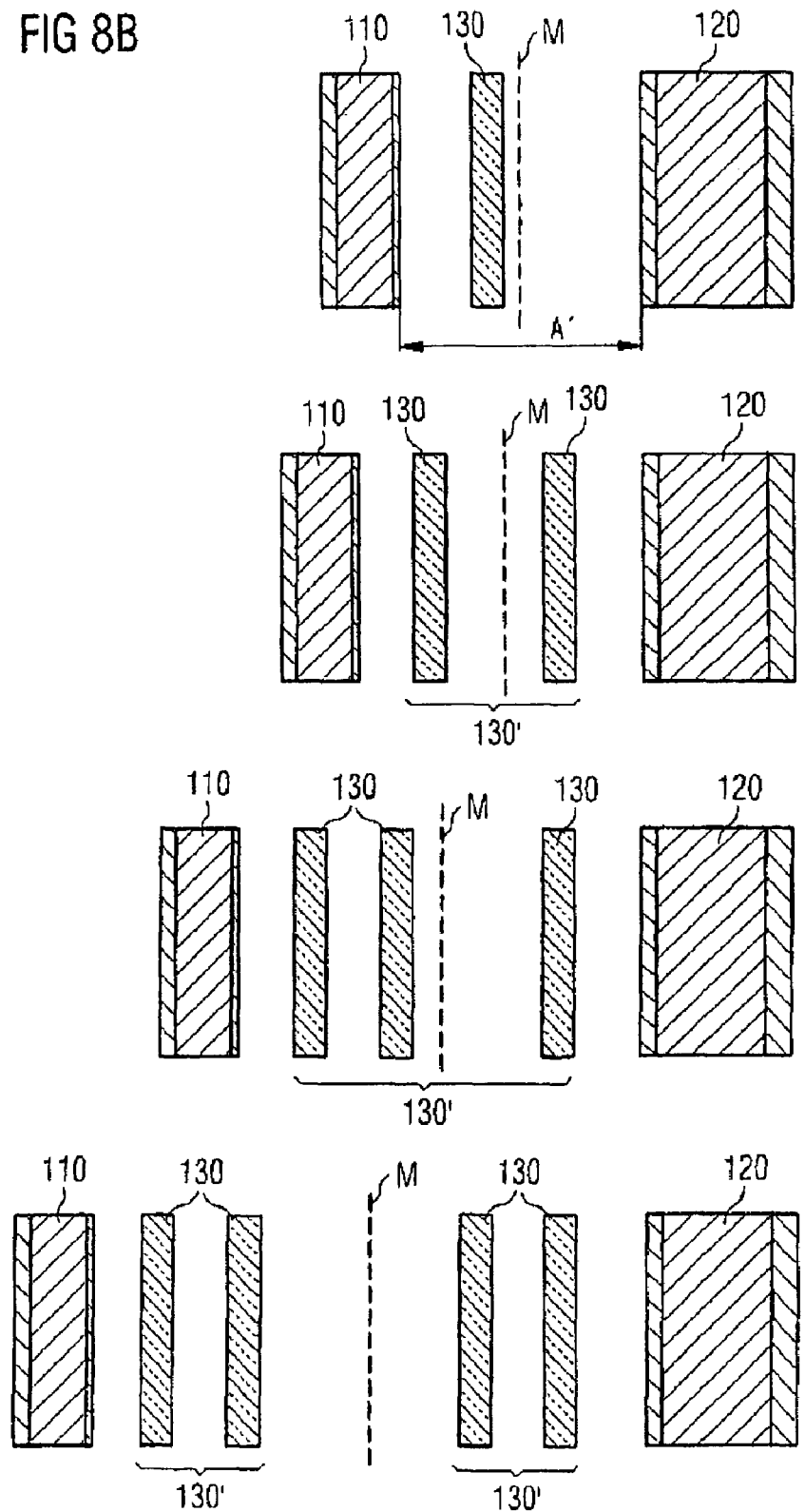

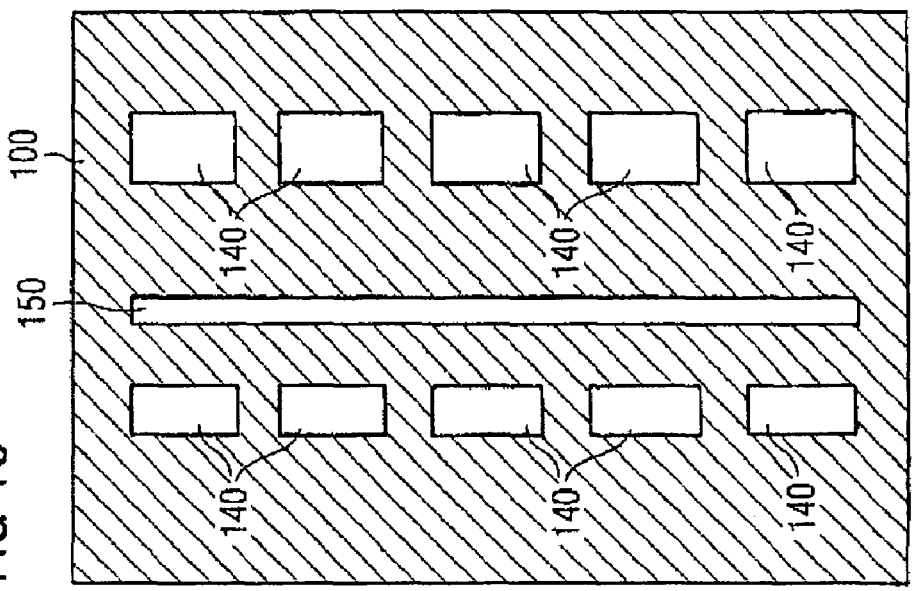
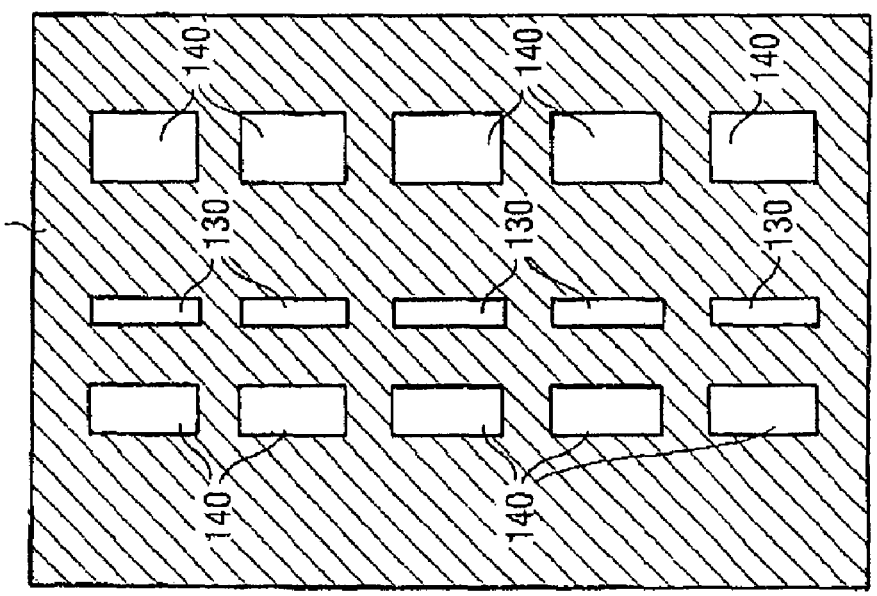

FIG 12

| V [nm] | A [nm] | B1 [nm] | B2 [nm] | ΔB1 [nm] | ΔB2 [nm] | Number of SRAFs |
|---|---|---|---|---|---|---|
| 0 | 300 | 100 | 200 | 0 | 0 | 1 |
| 0 | 310 | 100 | 200 | 0 | 5 | 1 |
| 0 | 320 | 100 | 200 | 0 | 5 | 1 |
| -5 | 330 | 100 | 200 | 5 | 10 | 1 |
| -5 | 340 | 100 | 200 | 5 | 15 | 1 |
| -10 | 350 | 100 | 200 | 10 | 15 | 1 |
| -15 | 360 | 100 | 200 | 10 | 15 | 1 |
| -20 | 370 | 100 | 200 | 15 | 20 | 1 |
| -25 | 380 | 100 | 200 | 15 | 20 | 1 |

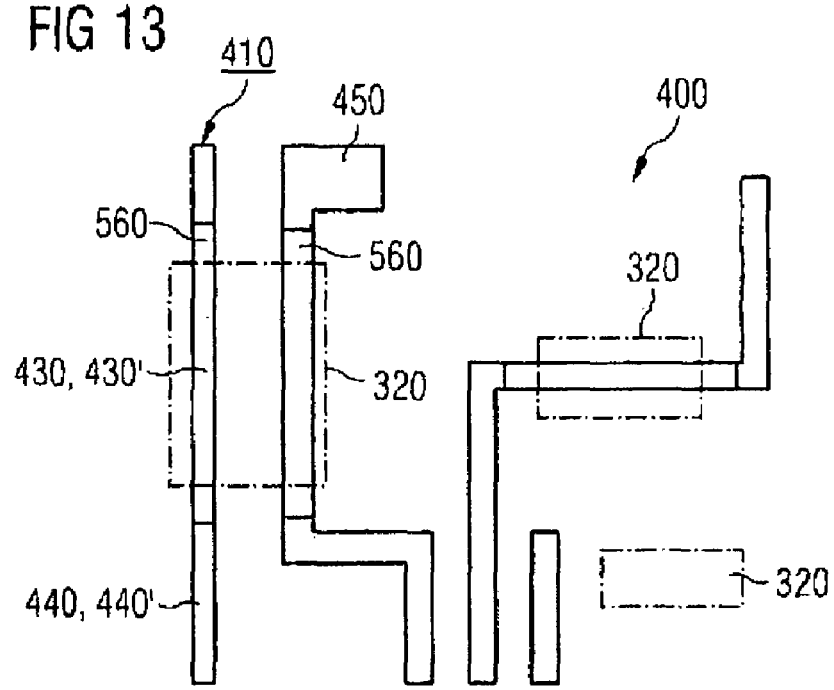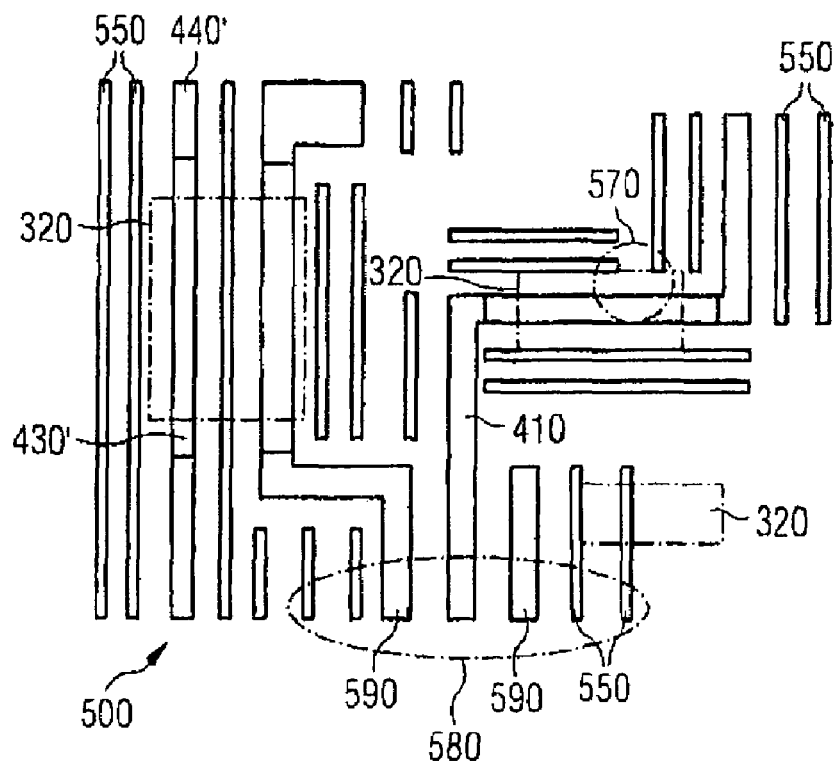

METHOD FOR PRODUCING A MASK LAYOUT AVOIDING IMAGING ERRORS FOR A MASK

This application claims priority to German Patent Application 10 2004 047 263.7 which was filed Sep. 24, 2004, and is incorporated herein by reference.

TECHNICAL FIELD

The invention relates to a method for producing a mask layout avoiding imaging errors for a mask.

BACKGROUND

It is known that, in lithography methods, imaging errors can occur if the structures to be imaged become very small and have a critical size or a critical distance with respect to one another. The critical size is generally referred to as the "CD" value (CD: critical dimension).

What is more, imaging errors may occur if structures are arranged so closely next to one another that they mutually influence one another during the imaging. These imaging errors based on "proximity effects" can be reduced by modifying the mask layout beforehand with regard to the "proximity phenomena" that occur. Methods for modifying the mask layout with regard to avoiding proximity effects are referred to by experts by the term OPC methods (OPC: optical proximity correction).

FIG. 1 illustrates a lithography process without OPC correction. The illustration reveals a mask 10 with a mask layout 20 that is intended to produce a desired photoresist structure 25 on a wafer 30. The mask layout 20 and the desired photoresist structure 25 are identical in the example in accordance with FIG. 1. A light beam 40 passes through the mask 10 and also a focusing lens 50 arranged downstream and falls onto the wafer 30, thereby imaging the mask layout 20 on the wafer 30 coated with photoresist. On account of proximity effects, imaging errors occur in the region of closely adjacent mask structures with the consequence that the resulting photoresist structure 60 on the wafer 30 in part deviates considerably from the mask layout 20 and thus from the desired photoresist structure 25. The photoresist structure that results on the wafer 30, the photoresist structure being designated by the reference symbol 60, is illustrated in enlarged fashion and schematically beneath the wafer 30 for improved illustration in FIGS. 1 and 2.

In order to avoid or to reduce these imaging errors, it is known to use OPC methods that modify the mask layout 20 beforehand in such a way that the resulting photoresist structure 60 on the wafer 30 corresponds to the greatest possible extent to the desired photoresist structure 25.

FIG. 2 shows a previously known OPC method described in the document "A little light magic" (Frank Schellenberg, IEEE Spectrum, September 2003, pages 34 to 39), which is incorporated herein by reference, in which the mask layout 20' is altered compared with the original mask layout 20 in accordance with FIG. 1. The modified mask layout 20' has structure alterations that are smaller than the optical resolution limit and, therefore, cannot be imaged "1:1". These structure alterations nevertheless influence the imaging behavior of the mask, as can be discerned at the bottom of FIG. 2. This is because the resulting photoresist structure 60 corresponds distinctly better to the desired photoresist structure 25 than is the case with the mask in accordance with FIG. 1.

In the case of the previously known OPC methods by which a "final" mask layout (see mask 20' in accordance with FIG. 2) is formed from a provisional auxiliary mask layout (e.g., the mask layout 20 in accordance with FIG. 1), a distinction is made between so-called "rule-based" and "model-based" OPC methods.

In the case of rule-based OPC methods, the formation of the final mask layout is carried out using rules, in particular tables, defined beforehand. The method disclosed in the two U.S. Pat. Nos. 5,821,014 and 5,242,770 (both of which are incorporated herein by reference), by way of example, may be interpreted as a rule-based OPC method, in the case of which optically non-resolvable auxiliary structures are added to the mask layout according to predetermined fixed rules, in order to achieve a better adaptation of the resulting photoresist structure (reference symbol 60 in accordance with FIGS. 1 and 2) to the desired photoresist structure (reference symbols 25 in accordance with FIGS. 1 and 2). In the case of these methods, then, a mask optimization is carried out according to fixed rules.

In model-based OPC methods, a lithography simulation method is carried out, in the course of which the exposure operation is simulated. The simulated resulting photoresist structure is compared with the desired photoresist structure, and the mask layout is varied or modified iteratively until a "final" mask layout is present, which achieves an optimum correspondence between the simulated photoresist structure and the desired photoresist structure. The lithography simulation is carried out with the aid of, for example, a DP-based lithography simulator that is based on a simulation model for the lithography process. For this purpose, the simulation model is determined beforehand by "fitting" or adapting model parameters to experimental data. The model parameters may be determined for example by evaluation of so-called OPC curves for various CD values or structure types. One example of an OPC curve is shown in FIG. 6 and will be explained in connection with the associated description of the figures. Model-based OPC simulators or OPC simulation programs are commercially available. A description is given of model-based OPC methods for example in the article "Simulation-based proximity correction in high-volume DRAM production" (Werner Fischer, Ines Anke, Giorgio Schweeger, Jörg Thiele; Optical Microlithography VIII, Christopher J. Progler, Editor, Proceedings of SPIE VOL. 4000 (2000), pages 1002 to 1009) and in the German Patent No. DE 101 33 127 C2, both of which are incorporated herein by reference.

Irrespective of whether an OPC method is a model-based or a rule-based OPC method, OPC variants can also differ with regard to their respective optimization aim. By way of example, so-called "target" OPC methods and so-called process window OPC methods, for example "defocus" OPC methods, have different optimization aims.

The aim of target OPC methods is to hit as accurately as possible the predefined target for the individual geometrical dimensions of the mask structures in the case of correctly complying with all the predefined technological and method conditions (e.g., focus, exposure dose, etc.). Thus, in the case of a target OPC variant it is assumed that all the predefined process parameters are "hit" or set and complied with in an ideal way. In this case, the term "target" is understood to mean the structure size of the main structures to be imaged.

Since the gate length of transistors is of crucial importance for their electrical behavior, target OPC methods are used in particular for the gate plane of masks. What is disadvantageous in the case of the target OPC variant, however, is that the predefined geometrical dimensions of the mask structures are actually complied with only when the predefined process parameters are complied with in a quasi exact fashion. If fluctuations in the process parameters occur, it is possible for, in some instances, considerable deviations to occur between the desired mask structures or mask dimensions and the actual resulting mask structures or mask dimensions. This may lead, for example, to a tearing away of lines or to a short circuit between lines. The resulting process window is, therefore, generally relatively small in the case of a target OPC method.

By contrast, process window OPC methods, for example defocus OPC methods, have the aim of making the process window—that is to say the permissible parameter range of the process parameters for the exposure process with the resulting mask—as large as possible in order to ensure that the mask specifications are complied with even in the case of process fluctuations. In this case, with defocus OPC methods it is accepted that the geometrical mask target dimensions are not met exactly. Deviations are, therefore, deliberately accepted in order to enlarge the process window and thus the tolerance range during later use of the mask.

A defocus OPC method is described for example in the above-mentioned German Patent No. DE 101 33 127. This method involves predefining a "fictitious" defocus value, which is taken as a basis for the simulation of the exposure operation. This defocus value specifies that the resist structure to be exposed with the mask lies somewhat outside the optimum focal plane. In the context of the OPC method, an attempt is made to achieve an optimum imagining behavior of the mask despite the defocusing purportedly present. Thus, an attempt is made to compensate for the imaging error caused by the purported defocusing. This "compensation operation" has the effect of changing the form of the mask layout in such a way that the line structures are made wider and as well a larger distance is produced between two adjacent line structures in each case. As a result, a mask is thus obtained with which, when using a focused exposure, the probability of the formation of wider line structures and the formation of larger distances between respectively adjacent line structures is greater than the probability of the formation of excessively small line structures and the formation of excessively small distances between adjacent line structures.

SUMMARY OF THE INVENTION

In one aspect, the invention improves a method of the type specified in the background to the effect that imaging errors, in particular as a result of proximity effects, are avoided even better than before.

Accordingly, it is provided according to embodiments of the invention that before carrying out the OPC method, with the provisional auxiliary mask layout, firstly a modified auxiliary mask layout is formed by arranging at least one optically non-resolvable auxiliary structure between two mask structures of the provisional auxiliary mask layout, the optically non-resolvable auxiliary structure being positioned between the two mask structures in a manner dependent on the structure size of the two mask structures. In concrete terms, an eccentric arrangement of the optically non-resolvable auxiliary structure between the two mask structures being effected in the case of differing structure sizes of the two mask structures.

One advantage of various embodiments of the method according to the invention is that an overall larger process window than in the case of the methods explained in the background is achieved, to be precise independently of the structure size and the structure geometry of the mask structures. In this case, the enlargement of the process window is achieved even when there are very large distances between the mask structures and even when there are very large differences in the structure size of adjacent mask structures. This is because, depending on the distance between the mask structures, the larger or else the smaller mask structure of two different mask structures can limit the process windows. Both effects are minimized according to embodiments of the invention by means of the eccentric positioning of the non-resolvable auxiliary structure.

A particularly large process window can be obtained, in accordance with one advantageous refinement of the method, if the distance between the two mask structures is additionally taken into account when predefining the eccentric offset with respect to a centrally centered arrangement.

Preferably, the eccentric offset is chosen to be all the larger, the larger the distance between the two mask structures and the larger the structure size difference between the two mask structures.

By way of example, the structure width of the two mask structures can be used as the structure size.

Preferably, the eccentric offset of the optically non-resolvable auxiliary structure is effected in such a way that the optically non-resolvable auxiliary structure is at a smaller distance from the smaller or narrower of the two mask structures than from the larger or wider of the two mask structures. An offset in the direction of the smaller or narrower mask structure is thus effected.

Moreover, it is regarded as advantageous if, in the case of a distance between the two mask structures above a predefined maximum distance, two or more optically non-resolvable auxiliary structures are arranged between the two mask structures. The arrangement of the two or more optically non-resolvable auxiliary structures is effected asymmetrically and eccentrically in a manner dependent on the structure size of the two mask structures if the structure sizes of the two mask structures differ. Through the use of a plurality of auxiliary structures, imaging errors can be reduced particularly well in the case of large structure spacings.

Preferably, the existence of lithographically effective elements in the vicinity of the two mask structures is additionally taken into account when predefining the offset. In this case, the existence of lithographically effective elements in the vicinity of the two mask structures is left out of consideration if their distance to the two mask structures or the optically non-resolvable auxiliary structures is greater than a predefined limit distance.

The optically non-resolvable auxiliary structures may be positioned, for example, with the aid of a table. The table predefines the eccentric offset at least in a manner dependent on the structure widths of the respective two mask structures and the distance between the respective two mask structures.

As an alternative, the optically non-resolvable auxiliary structures are positioned with the aid of a simulation program.

Moreover, strips oriented perpendicularly to the respectively assigned mask structures may be added as the optically non-resolvable auxiliary structures. In this case, the perpendicular strips may be arranged for example in groups, in particular to form structures like zebra stripes.

Preferably, the width of the optically non-resolvable auxiliary structures is chosen in a manner dependent on the distance between the two mask structures and/or the structure widths of the two mask structures.

As explained in the background, a model-based OPC method or a rule-based OPC method may be used as the OPC method.

A modified arrangement of the optically non-resolvable auxiliary structures is preferably performed in the case of contact holes in order to achieve an optimum imagining behavior. In this case, adjacent optically non-resolvable auxiliary structures may be connected to one another, for example, to form a communal structure.

Moreover, it is regarded as advantageous if the mask structures of the provisional auxiliary mask layout are enlarged, in particular widened, or reduced in size to form altered mask structures in accordance with a predefined set of rules. This may be done before or after the non-resolvable auxiliary structures are supplemented. Afterward, the modified auxiliary mask layout is then subjected to the "actual" OPC method, in the course of which the final mask layout is then formed. One advantage of this variant of the method is that an even larger process window for carrying out the lithography method is achieved than is otherwise the case. Moreover, the optically non-resolvable auxiliary structures can be arranged at a greater distance from the assigned main structures than is the case for example with the rule-based OPC methods with optical auxiliary structures that is disclosed in the U.S. patents mentioned above. Therefore, fewer hard mask specifications are to be complied with with regard to the non-resolvable optical auxiliary structures. Moreover, there is a reduced probability of the auxiliary structures being imaged undesirably under unfavorable conditions. Moreover, the lithography method can also be carried out in "overexposure", thereby reducing the probability of auxiliary structures being imaged undesirably under unfavorable conditions. In particular, fluctuations in the structure widths over the entire mask (CD uniformity) are transferred to the wafer to a lesser extent, which is reflected in a low MEEF (mask error enhancement factor) value. In addition, the auxiliary structures may be wider than in the case of the previously known correction method described in the U.S. patents mentioned above, so that the "process window" is enlarged in this respect, too. The masks thus become easier to produce and less expensive. In addition, on account of the enlargement of the process window, moreover the dependence of the CD value on the main structure, is lower than otherwise, so that photoresist structures that can be produced with the mask react less to process and target fluctuations. This also relates, in particular, to the etching process following the photoresist development, since OPC is often employed after the etching step in the gate contact-connection plane. In other words, the OPC correction is effected in such a way that the CD corresponds to the design value after etching. In this case, the term "target" is understood to mean the structure size of the main structures to be imaged. On account of the enlargement or reduction in size of the mask structures and as a result of the addition of the optical auxiliary structures, already such a distinct improvement in the imaging behavior of the mask is achieved that generally the processing times in the subsequent OPC step are significantly reduced, namely because the deviations between the resulting photoresist structure and the desired photoresist structure are already greatly reduced by the "preoptimization".

It is preferably provided that a model-based OPC method is to be carried out as the OPC method—this therefore means the main optimization method is to be carried out after the pre-optimization. The advantage of a model-based OPC method (or OPC simulation program) over a rule-based OPC method is that only relatively few measurement data have to be recorded in order to be able to determine the model parameters required for the method. Afterward, virtually arbitrary structures can then be simulated. In contrast to this, in the case of a rule-based OPC method, comparatively extensive test measurements on the basis of structures that have really been produced are necessary in order to be able to establish the tables or rules required for carrying out the rule-based OPC method.

With regard to the enlargement or reduction in size of the mask structures—this modification step is referred to hereinafter for short as "pre-bias step"—, it is regarded as advantageous if the set of rules to be employed is stored in the form of a table and the extent of enlargement or reduction in size—that is to say the "pre-bias"—is read from the table for each mask structure of the provisional auxiliary mask layout. On account of the "pre-bias" values being stored in a table, the pre-bias method step can be carried out very rapidly.

In this case, the discretization of the table values or of the table (=difference between the successive table values) is preferably identical to the discretization of the grid structure (=distance between the grid points) used in the subsequent OPC method, in order to enable an optimum further processing of the structure changes produced in the pre-bias step in the subsequent OPC method. As an alternative, the discretization of the table may also be twice as large as the discretization of the grid structure used in the OPC method, for example when the lines are intended to be "biased" (=enlarged or reduced in size) symmetrically with respect to their line center, since the bias effect respectively always occurs doubly in such a case.

As an alternative to a set of rules stored in the form of a table, the set of rules may also be stored in a mathematical function, the extent of enlargement or reduction in size— that is to say the pre-bias—of the mask structures of the provisional auxiliary mask layout being calculated for each of the mask structures with the aid of the mathematical function.

Preferably, the set of rules defines the extent of the enlargement or reduction in size of the mask structures of the provisional auxiliary mask layout in two-dimensional form, so that actual two-dimensional geometrical design structures can be taken into account.

Moreover, the set of rules takes account of mask structures having dimensions in the CD range separately by defining CD classes with, in each case, a minimum and maximum structure size, and wherein an identical set of rules is employed within each CD class.

Moreover, the set of rules may provide additional rules to be applied to line ends and contact holes. By way of example, line ends or contact holes are lengthened or shortened or rounded or serif-like structures or so-called hammerheads are added.

Moreover, the set of rules may deal differently with mask structures that represent wirings and those that define the gate or the gate length of transistors, by virtue of the fact that different sets of rules are employed in each case therefor.

In addition, the set of rules preferably also takes into account, besides the CD value, the distance between the main structures of the provisional auxiliary mask layout by using a two-dimensional bias matrix, that is to say a bias matrix dependent on the CD value and on the distance.

The sets of rules used are determined either experimentally on the basis of test structures or by means of lithography simulation.

In accordance with a further advantageous refinement of the method, it is provided that at least two different OPC variants are used in the context of the OPC method in that the provisional auxiliary mask layout is subdivided into at least two layout regions, and each of the layout regions is processed according to one of the at least two OPC variants. What is thereby achieved is that each of the layout regions is optimized with an individually assigned OPC variant that is particularly suitable in each case for the respective layout region. Consequently, according to the invention, there is no "overall", mask-embracing identical optimization for all layout regions of the layout, but instead an individual optimization relative to layout regions. What is achieved as a result of this procedure is that after the conclusion of the OPC method, a final mask layout is present with which a particularly high process stability is achieved. In this case, the term "process stability" is understood to mean that, on the one hand, a sufficiently large process window is achieved and, on the other hand, the predefined mask parameters or target parameters are attained in an optimum manner. Moreover, fewer OPC process cycles or OPC passes are regularly required overall until the optimum, final mask layout has been determined than is the case with the previously known "pure" target OPC and "pure" defocus OPC methods. A significant process acceleration is thus additionally achieved on account of the separation of the mask layout into at least two layout regions and the optimization of these layout regions for each of them individually. Furthermore, there is generally no need for a post-processing process. In this case, a post-processing process is understood to mean that mask defects possibly present in the final mask layout are eliminated manually or by means of further optimization programs using DP systems. This is because, on account of the individual optimization in terms of layout regions, the method according to embodiments of the invention in general does not require manual "reworking" of the mask layout, because mask defects occur only seldom enough to be negligible. In addition, it is possible to resort to already known and tried and tested OPC variants. It is necessary merely to carry out a subdivision of layout regions and to select the OPC variant particularly suitable in each case for the respective layout regions of the mask layout.

Since, as explained above, process window OPC methods, in particular defocus OPC methods, and target OPC methods are already tried and tested in practice, it is regarded as advantageous, in the context of one development of the method, if the method comprises at least one process window OPC variant, in particular a defocus OPC variant, and/or at least one target OPC variant.

As has already been explained in the background, gate structures of transistors, in particular, are especially critical since with these structures it is particularly important to comply with the predefined geometrical dimensions, in particular the gate length. It is, therefore, regarded as advantageous, in the context of a further development of the method, if the provisional auxiliary mask layout is subdivided into a layout region with active structures and into a layout region with inactive structures, so that particular attention can be given to the specific optimization requirements of the active structures.

Preferably, the layout region with the active structures is subjected to the target OPC variant and the layout region with the inactive structures is subjected to the defocus OPC variant. In this case, the gate structures of transistors are preferably treated as the active structures.

The active layout regions can be determined particularly simply and thus advantageously if the provisional auxiliary mask layout and the mask layout—describing the active regions and thus the gate structures—of masks prearranged in terms of layout are "made one above the other" by software or manually, and those regions that lie above active zones—for example diffusion zones—are treated as active structures. The masks that define the diffusion zones, for example, may be used for the "process of laying one above the other".

Furthermore, it is regarded as advantageous if transition regions ("buffer zones") are formed between the active and the inactive layout regions and are optimized separately. The buffer zones may also be assigned to the target OPC variant, for example.

Both for the defocus OPC variant and for the target OPC variant, it is advantageously possible to select, in each case, either a model-based OPC variant or a rule-based OPC variant; however, model-based variants are preferable in each case.

Furthermore, it is regarded as advantageous if those layout regions that are provided with the optically non-resolvable auxiliary structures are subjected to a different OPC variant than the layout regions without the optically non-resolvable auxiliary structures. By way of example, the layout regions with the optically non-resolvable auxiliary structures may be subjected to a target OPC variant, and the surrounding layout regions may be subjected to a defocus OPC variant.

Since the layout regions with the active structures are very critical because the electrical behavior of the later electrical components is generally dependent on these structures, it is regarded as advantageous if firstly the layout regions with the active structures, in particular firstly the layout regions with the gate structures, are supplemented with optically non-resolvable auxiliary structures. It is only if the active structures are provided with the optically non-resolvable auxiliary structures that the remaining layout regions are then also optimized correspondingly.

Moreover, it is regarded as advantageous if exclusively the active layout regions, in particular exclusively the layout regions with the gate structures, are supplemented with the optically resolvable auxiliary structures. Specifically, this precludes the situation in which optically non-resolvable auxiliary structures for inactive layout regions can impair adjoining active layout regions.

Furthermore, it is preferably ensured when producing the final mask layout that wiring regions do not lie above active layout regions if the latter are not intended to be contact-connected.

Moreover, when producing the final mask layout, pad structures (e.g., "landing pads") and remaining wiring structures are preferably treated differently, since pad structures, on account of the contact-connecting steps subsequently required, are subject to different requirements than the remaining wiring structures. A target OPC variant is preferably used when producing the mask layout for pad structures.

Furthermore, it is regarded as advantageous if the method is carried out—in particular exclusively—on non-gate planes, for example on RX regions (=diffusion zones in the case of logic chips) and/or on metallization planes.

Moreover, CD-critical and non-CD-critical structures may advantageously be treated with different OPC variants.

By way of example, the method can be used for DRAM mask layouts. In this case, cell array structures and cell array edge structures are then preferably processed with different OPC variants. This is because the cell array edge often comprises dummy structures that are not required functionally in electrical terms, thus electrically required mask structures and unrequired dummy structures are preferably treated differently.

The method according to embodiments of the invention can be carried out particularly simply and rapidly by means of a DP system or by means of a computer.

BRIEF DESCRIPTION OF THE DRAWINGS

For a more complete understanding of the present invention, and the advantages thereof, reference is now made to the following descriptions taken in conjunction with the accompanying drawing, in which:

FIG. 1 shows an illustration of the lithographic process without OPC;

FIG. 2 show an illustration of the lithographic process with OPC;

FIG. 2A shows an illustration of the dependence of the CD value on the distance between the mask structures among one another ("OPC curve");

FIGS. 3A and 3B show a first exemplary embodiment of the method according to the invention with large distances between the mask structures;

FIGS. 4A and 4B show the first exemplary embodiment of the method according to the invention with small distances between the mask structures;

FIG. 5 shows a diagram showing the resulting process window for a structure in accordance with FIGS. 3A to 4B in the case of a target OPC method;

FIG. 6 shows a diagram showing the resulting process window for a structure in accordance with FIGS. 3A to 4B in the case of a process window OPC method;

FIG. 7 shows diagrams showing, by way of example, a comparison between target OPC and process window OPC methods;

FIGS. 8A and 8B show, as a second exemplary embodiment of the method according to the invention, the positioning of a plurality of scatterbars or scatterbar groups (comprising 2, 3 or 4 scatterbars) with small and large distances between the mask structures;

FIGS. 9 and 10 show, by way of example, the positioning of non-resolvable auxiliary structures in the vicinity of contact holes (third exemplary embodiment);

FIG. 12 shows, by way of example, a table that predefines the eccentric offset for positioning of the non-resolvable auxiliary structures;

FIG. 13 shows a provisional auxiliary mask layout that is processed in accordance with a fifth exemplary embodiment of the method according to the invention;

FIG. 14 shows a final mask layout formed from the provisional auxiliary mask layout in accordance with FIG. 13;

Figure 11:
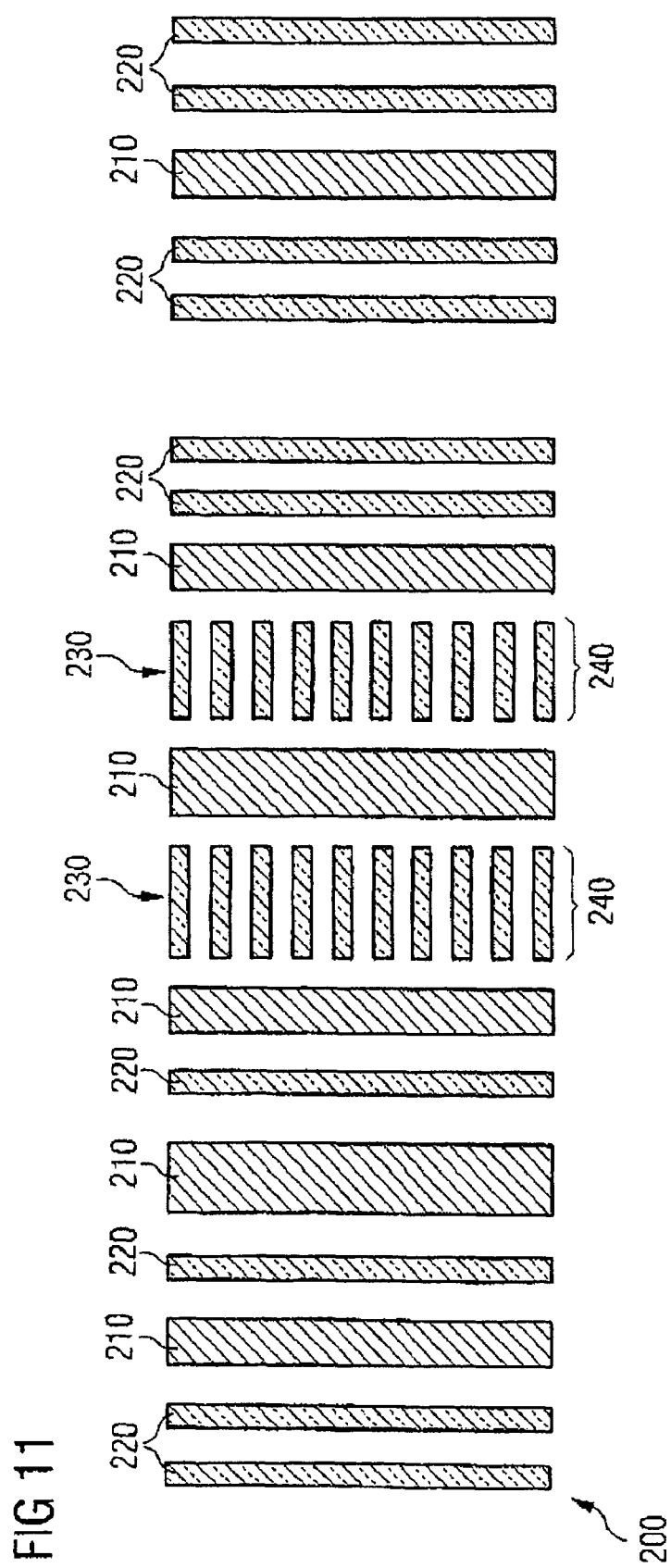
FIG. 11 shows, by way of example, a structure with a zebra-stripe-like arrangement of the non-resolvable auxiliary structures (fourth exemplary embodiment)

The following list of reference symbols can be used in conjunction with the figures:

10 Mask
20 Mask layout
20' Modified or final mask layout
25 Photoresist structure
30 Wafer
40 Light beam
50 Focusing lens
60 Resulting photoresist structure
70 OPC curve
71 Isolated lines
72 Semi-dense structures
73 Very dense structures
100 Provisional auxiliary mask layout
100' Modified auxiliary mask layout
110 Narrow structure, "line"
120 Wide structure, "line"
130 Scatterbar, non-imaging
130'Scatterbar group, non-imaging
140 Contact holes
150 Continuous individual scatterbar
200 Useful structure
210 Parallel lines, non-imaging
220 Perpendicular lines, non-imaging
230 Scatterbar, non-imaging
240 Zebra structures, non-imaging
320 Diffusion zone
400 Provisional auxiliary mask layout
410 Interconnect structures
430 Active structures
430' Active layout regions
440 Passive structures
440' Passive layout regions
450 Landing pads
500 Final mask layout
550 SRAF auxiliary structures, non-imaging
560 Buffer zone
570 Defect region
580 Defect region
590 External interconnect structure
600 Region where contact is made
V Offset
ΔB Width difference
B1, B2 Line width
A Distance
M Center

DETAILED DESCRIPTION OF ILLUSTRATIVE EMBODIMENTS

FIG. 2A illustrates an OPC curve 70 specifying how the CD values vary in a manner dependent on the distance between the main structures, for example thus in the case of lines. In the case of isolated lines 71, the CD value is largely independent of the distance between the structures. In the case of average, semi-dense main structures 72, the CD value falls in the direction of smaller structure distances before it rises significantly again in the case of very dense structures 73.

In this case, the OPC curve 70 describes the CD value profile on the wafer given a constant mask CD value, which is likewise depicted in FIG. 2A for comparison.

FIGS. 3A and 3B show, by way of example, the eccentric arrangement according to the invention of optically non-resolvable auxiliary structures (first exemplary embodiment).

FIG. 3A reveals a provisional auxiliary mask layout 100 comprising two lines (or bars) 110 and 120 arranged at a distance A. The two lines have different structures widths B1 and B2. A scatterbar 130 is added as an optically non-resolvable auxiliary structure between the two lines 110 and 120. As can be discerned in FIG. 3A, the scatterbar 130 is offset by an offset V relative to the centre M between the two bars 110 and 120. The size of offset V is chosen in a manner dependent on the width difference ΔB where $$\Delta B = B1 - B2$$

and the distance A between the lines and can be gathered for example from the table in FIG. 12. The offset V is thus a function of the following variables:

$$V = f(\Delta B, A)$$

As an alternative, the absolute values of the widths may also have an influence in addition. In this case, then, the offset V would be a function of the following variables:

$$V = f(\Delta B, B1, B2, A)$$

After the eccentric positioning of the scatterbar 130, the mask structures 110 and 120 are widened, to be precise, for example, according to fixedly predefined rules stored in a set of rules table. The set of rules table may, for example, be integrated in the table illustrated in FIG. 12, in which the offset values V for the eccentric positioning of the scatterbar 130 are entered. In the table in FIG. 12 and also in FIG. 3B, the widening values are designated by ΔB1 for the "widening" of the width B1 of the bar 110 and ΔB2 for the for the "widening" of the width B2 of the line 120.

FIG. 3B shows the resulting modified auxiliary mask layout 100' comprising the lines 110 and 120 modified in their width and the scatterbar 130. It can be discerned that the distance A' between the two lines 110 and 120 decreases slightly owing to the line widening.

In the exemplary table in FIG. 12, the width of the scatterbars 130 has been assumed to be constant (width=40 nm); it goes without saying that scatterbar widths other than 40 nm could also be taken into account in the table, so that the table would need to be extended accordingly. Offset values V for 300 nm<A<380 nm, B1=100 nm and B2=200 nm are entered in the table in FIG. 12. The table can also be made more comprehensive and take account of the following ranges of values, for example: 300 nm<A<1000 nm, 100 nm<B1, B2<400 nm.

FIGS. 4A and 4B show the addition of a scatterbar 130 for the case where the distance A between the two lines 110 and 120 is relatively small. It is evident that although the arrangement of the scatterbar 130 is eccentric, the offset V is relatively small. Thus, it is preferred for a small offset value V to be chosen in the case of small distances A and for a large offset value to be chosen in the case of large distances A if the two lines 110 and 120 have different widths—as assumed in the present example.

FIG. 5 shows a diagram specifying the optimum offset V in each case for the two auxiliary mask layouts 100 shown in FIGS. 3A to 4B. The diagram illustrates a defocus value DOF (=depth of focus) in μm for an EDL value (=exposure dose latitude) of 7%; the offset V at which the largest process window (PW) is attained can thus be read from the diagram. The diagram in accordance with FIG. 5 takes account of the case where a target OPC is subsequently carried out in order to form the final mask layout.

The diagram in FIG. 5 is based on the following parameters for the structure 100:

Width B1=100 nm
Width B2=200 nm
Width of the scatterbar=40 nm
Minimum distance $A_{min}$ between the lines=300 nm
Maximum distance $A_{max}$ between the lines=400 nm
OPC grid=2.5 nm Moreover, the assumption is made in the diagram that an anchor structure comprising a multiplicity of parallel lines having a line width of 90 nm and a line spacing of 120 nm is present besides the structure 100 illustrated in FIGS. 3A to 4B.

It can be discerned that when there is a small distance of only 300 nm between the lines 110 and 120, the scatterbar 130 is optimally positioned near the center M; the offset V is therefore very small (V=approximately −5 nm). When there is a large distance of 400 nm between the two lines 110 and 120, the optimum position of the scatterbar 130 is highly eccentric, to be precise with an offset of approximately V=−30 nm (offset in the direction of the narrower lines 110).

FIG. 6 shows a corresponding diagram for the case where a process window OPC (PW-OPC) for forming the final mask layout is carried after the positioning of the scatterbar 130 and the widening of the two line widths B1 and B2.

It is evident that when there is a small distance A=300 nm between the two lines 110 and 120, the offset V does not have a great influence. In the case of large distances A=400 nm, however, the optimum positioning of the scatterbar 130 lies distinctly in the eccentric region. An optimum offset V of approximately −40 nm can be read; a maximum process window size is achieved with this offset because the DOF value and thus the maximum permissible defocusing when processing the mask structures assumes its largest value (DOF=0.42 μm).

The diagrams in FIGS. 5 and 6 do not reveal whether the "useful structure" 100 or the anchor structure that is likewise taken into account as has already been mentioned above limits the process window, because the resulting process window is specified for the overall structure. The elements that limit the process window are additionally plotted in FIG. 7.

The left-hand diagram of FIG. 7 shows the process window for a target OPC (lower line) and for a process window OPC (upper line) for the case of a maximum bar distance A=400 nm. The narrower line 110 limits the process window over the entire offset range ΔV1 (−55 nm<V<20 nm).

The right-hand diagram of FIG. 7 shows the process window for a target OPC (lower line) and a process window OPC (upper line) for the case of a minimum bar distance A=300 nm. The narrower bar 110 limits the process window in the offset range ΔV2 (−30 nm<V<−20 nm). The wider bar 120 limits the process window in the offset range ΔV3 (−20 nm<V<5 nm), both the anchor structure and the wider line 120 equally limiting the process window for the special case V4=−5 nm.

FIGS. 8A and 8B show the eccentric arrangement of scatterbars 130 for the case where two or more scatterbars 130 are to be arranged on account of the large distance A between the two lines 110 and 120 (second exemplary embodiment). It is evident in both figures that when there are two or more scatterbars 130, the resulting scatterbar group 130' is jointly offset; a "group offset" as it were is effected, the offset V of the scatterbar group 130' being determined according to criteria explained above.

FIG. 8A shows that the arrangement of the scatterbar group 130' is effected only slightly eccentrically when there are small distances A between the two lines 110 and 120. In the case of large distances, illustrated in FIG. 8B, the offset of the scatterbar group 130' is distinctly larger. In the bottommost structure in FIG. 8B, the distance between the two lines is so large that two separate scatterbar groups 130' are formed, which are in each case assigned only to one of the two lines. The two bars 110 and 120 are thus treated as individual lines.

FIGS. 9 and 10 show the arrangement of scatterbars 130 by way of example for the case of contact holes 140 as useful structure or "provisional auxiliary mask layout" 100 (third exemplary embodiment). Only the scatterbars between the rows of contact holes are illustrated. It is evident that the scatterbars 130 can be arranged separately (see FIG. 9) or can be formed by a continuous individual scatterbar 150.

FIG. 11 shows a relatively complex useful structure 200 that forms a provisional auxiliary mask layout. The useful structure 200 comprises parallel lines 210 having different widths and at different distances (four exemplary embodiment). Depending on the distance, scatterbars 220 and 230 are added as non-resolvable auxiliary structures in order to form a modified auxiliary mask layout from the provisional auxiliary mask layout. In this case, the scatterbars may run parallel to the lines 210 (scatterbars 220) or else be arranged perpendicular thereto (scatterbars 230). The perpendicularly arranged scatterbars 230 thus form "zebra structures" 240 that modify the provisional auxiliary mask layout. The zebra structures 240 are preferably used in the case of medium to large line distances for which, in the case of using parallel scatterbars 220, it would be necessary to arrange two or more parallel scatterbars. The advantage of the zebra structures 240 is that they improve the so-called MEEF (Mask Error Enhancement Factor).

A fifth exemplary embodiment of the method according to the invention will now be explained in connection with FIGS. 13 and 14.

FIG. 13 shows a provisional auxiliary mask layout 400, which defines metallization structures or interconnect structures 410. The interconnect structures 410 are predefined by an electrical circuit diagram.

The provisional auxiliary mask layout 400 has active layout regions 430' for active structures 430 and also inactive or passive layout regions 440' for inactive or passive structures 440. In this case, as already explained above, the active layout regions 430' are understood to be those layout regions of the provisional auxiliary mask layout 400 that are arranged above the active zones of the electrical circuit. Active zones are formed for example by the diffusion zones of transistors that are contact-connected by means of the active layout regions 430' of the auxiliary mask layout 400.

The inactive layout regions 440' are understood to be those layout regions that are arranged outside active zones and thus essentially form connections between the active layout regions 430' or to external terminal pads ("landing pads" or contact hole landing points) 450.

Prior to carrying out an OPC method, in a first preparatory step, the provisional auxiliary mask layout 400 is subdivided into the active layout regions 430' and into the passive or inactive layout regions 440' in order that these can be treated differently.

In order to ascertain which layout regions of the provisional auxiliary mask layout 400 are active layout regions and which are inactive layout regions, the provisional auxiliary mask layout 400 is laid over the mask layouts of the prearranged masks—that is to say over the mask layouts of those masks that are processed prior to the mask with the mask layout 400 in accordance with FIG. 14. The process of laying the mask layouts of different mask planes one on top of the other can be effected manually or preferably with the aid of an electronic data processing system. The regions in which interconnect structures lie above diffusion zones can be discerned as a result of the masks being laid one on top of the other. The zones are regarded hereinafter as the active layout regions 430'.

Those layout regions of the provisional auxiliary mask layout 400 that lie above active zones (transistor zones, in particular diffusion zones or gate regions of transistors, etc.) are thus identified as active layout regions 430'. The remaining layout regions are identified as inactive layout regions 440'.

With the provisional auxiliary mask layout 400, a final mask layout 500 is then formed. FIG. 14 in this case shows the mask layout after optically non-resolvable SRAF auxiliary structures have been added to the mask layout, more or less eccentrically depending on the structure. The structure segmentation that usually occurs is not illustrated in FIG. 14 for reasons of clarity.

When the subsequent OPC method is carried out, the active layout regions 430' and the passive layout regions 440' are treated differently since the active layout regions and the passive layout regions are subject to different tolerance requirements. In concrete terms, the layout regions 430' with the active structures 430 are subjected to a target OPC method (or a target OPC variant), whereas the layout regions 440' with the passive structures 440 are optimized by means of a defocus OPC method (or defocus OPC variant).

Buffer zones 560 may furthermore be formed in the boundary regions between the active layout regions 430' and the inactive layout regions 440', the buffer zones optionally being treated like the active layout regions 430', like the passive layout regions 440' or in accordance with a dedicated optimization method. The buffer zones 560 serve to take account of, and as far as possible to compensate for, overlay fluctuations or the offset of different lithography planes with respect to one another.

FIGS. 14-17 illustrate the different procedures for the positioning of the scatterbars (SRAF) 550 and the treatment of landing pads.

As can be discerned in FIG. 14, in the case of conventional positioning of the optically non-resolvable auxiliary structures 550, it is possible to discern regions in which the optically non-resolvable auxiliary structures (SRAF) 550 are not arranged optimally. By way of example, in the region 570 optically non-resolvable auxiliary structures 550 are placed in non-parallel fashion along the gate (active structure), as a result of which imaging errors may occur in the case of the CD-critical active structure. The wiring structure (passive structure) situated on the right above the gate is, by contrast, erroneously optimally supported by SRAF 550. The "gate first approach" described further below in connection with FIG. 15 eliminates this potential defect.

In a different region 580 of FIG. 14, no SRAF structures 550 can be arranged owing to the excessively small distance between the wiring interconnects. In this region 580, corrections in accordance with defocus OPC (or some other process window OPC variant) are performed for the structures of the non-active zones.

In accordance with a sixth exemplary embodiment of the method according to the invention, the positioning of the optically non-resolvable auxiliary structures 550 is performed in another way. This is shown in connection with FIG. 15.

Figure 15:
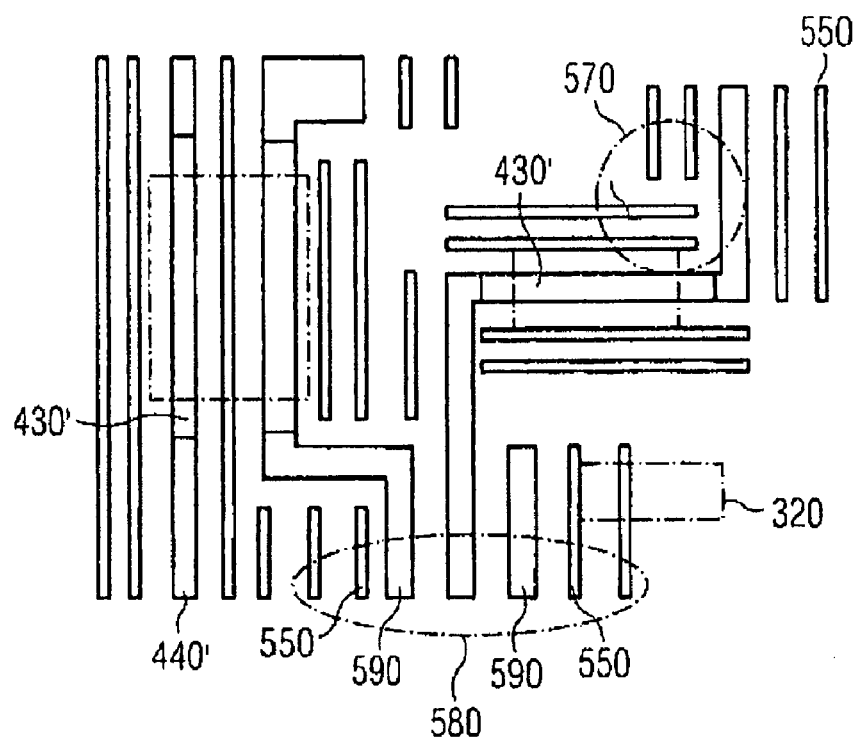
FIG. 15 shows a sixth exemplary embodiment of the method according to the invention, in which optically non-resolvable structures are firstly positioned in active layout regions.

It is evident that, in the sixth exemplary embodiment in accordance with FIG. 15 the optically non-resolvable auxiliary structures 550 are firstly arranged in the region of the active layout regions 430', and only afterward are arranged in the region of the inactive layout regions 440'. This ensures that the optically non-resolvable auxiliary structures 550 cannot be arranged defectively in the region of the particularly critical active layout regions 430'. By way of example, the problem of effective SRAF positioning in the region 570 (see FIG. 14) is eliminated in this way.

The positioning of the optically non-resolvable auxiliary structures 550 in the region of the active layout region 430' may also be referred to as "gate first positioning" since the optically active regions 430' are regularly formed by the gate regions of transistors.

Figure 16:
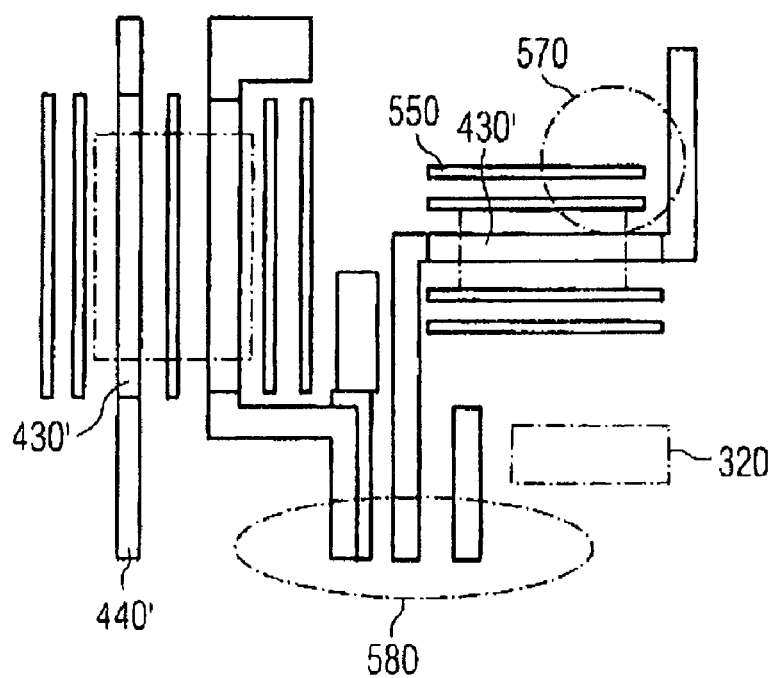
FIGS. 16 and 17 show a seventh, eighth and ninth exemplary embodiment of the method according to the invention, in which optically non-resolvable structures are positioned exclusively in active layout regions, and contact hole charge regions (landing pads) and wiring structures above diffusion zones are treated separately.
Figure 17:
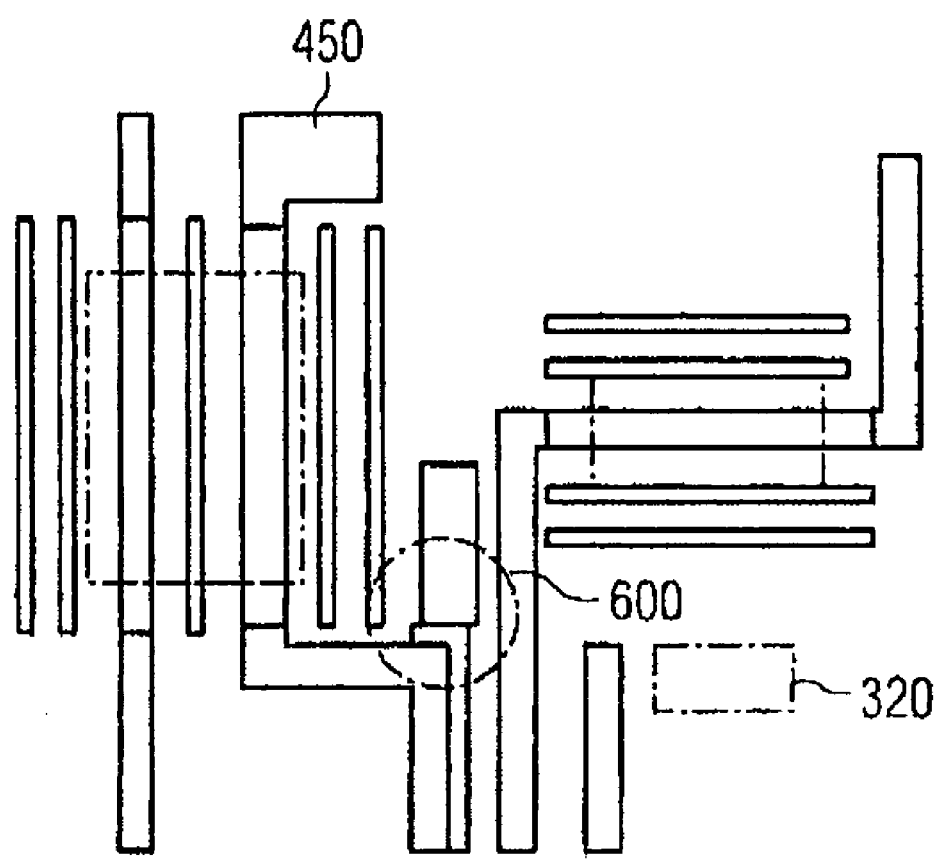

In a seventh exemplary embodiment of the method, the SRAF auxiliary structures 550 are arranged exclusively in the region of the active layout regions 430' (see FIGS. 16 and 17). No SRAF auxiliary structures are positioned in the remaining layout regions 440' ("gate-only" positioning as seventh exemplary embodiment).

It can be discerned in FIG. 17 that despite the optimization of the mask layout, it is possible for regions 600 to occur in which the inactive layout region 440' make contact with the active layout regions 430' after the OPC method has been carried out. These problems may occur in isolated fashion since, as explained above, the inactive layout regions 440' are processed by means of a defocus OPC method, so that a certain expanding of lines and/or corners occurs. Such regions where contact is made must be detected, if appropriate in the course of an aftertreatment, for example an automatic or manual aftertreatment, and repaired (eighth exemplary embodiment).

It can additionally be discerned in FIG. 17 that these landing pads 450 are preferably likewise subjected to a separate treatment (ninth exemplary embodiment), since customary self-aligned contacts generally cannot be used for landing pads. This is because landing pads regularly have particular overlay requirements since landing pads, on the one hand, must not become too small, in order that contact connection remains possible, and, on the other hand, must not become too large, in order to avoid short circuits ("bridging") with adjacent wiring structures. Consequently, for landing pads a target OPC method is generally preferable to a defocus OPC method.

Just like the active layout regions, landing pads can be identified by mask layouts being laid one on top of the other; as an alternative, the landing pads can also be identified manually or with the aid of a dead processing system on the basis of their typical geometrical dimensions or on the basis of the specifications of the electrical circuit.

What is claimed is:

1. A method for producing a final mask layout for a mask, the method comprising:
   producing a provisional auxiliary mask;
   forming a modified auxiliary mask layout with the provisional auxiliary mask layout by arranging at least one optically non-resolvable auxiliary structure between two mask structures of the provisional auxiliary mask layout, the optically non-resolvable auxiliary structure being positioned between the two mask structures in a manner dependent on a structure size of the two mask structures, an eccentric offset of the optically non-resolvable auxiliary structure between the two mask structures being effected in the case of differing structure sizes of the two mask structures; and
   converting the modified auxiliary mask layout into the final mask layout with the aid of an OPC method,
   wherein a distance between the two mask structures is additionally taken into account when predefining the eccentric offset, and wherein the optically non-resolvable auxiliary structure is asymmetrically located relative to a central axis separating the two mask structures.

2. The method as claimed in claim 1, wherein the eccentric offset that is chosen to be all the larger, the larger the distance between the two mask structures and the larger the structure size difference between the two mask structures.

3. The method as claimed in claim 1, wherein the structure size comprises a structure width of the two mask structures.

4. The method as claimed in claim 1, wherein:
   in the case of a distance between the two mask structures above a predefined maximum distance, two or more optically non-resolvable auxiliary structures are arranged between the two mask structures; and
   the arrangement of the two or more optically non-resolvable auxiliary structures between the two mask structures being effected in a manner dependent on the structure size of the two mask structures in such a way that an asymmetrical, eccentric arrangement of the optically non-resolvable auxiliary structures between the two mask structures is effected in the case of differing structure sizes.

5. The method as claimed in claim 1, wherein the existence of lithographically effective elements in the vicinity of the two mask structures is additionally taken into account when predefining the offset with respect to a structure center.

6. The method as claimed in claim 5, wherein the existence of lithographically effective elements in the vicinity of the two mask structures is left out of consideration if their distance to the two mask structures or the optically non-resolvable auxiliary structures is greater than a predefined limit distance.

7. The method as claimed in claim 1, wherein the optically non-resolvable auxiliary structures are positioned with the aid of a table.

8. The method as claimed in claim 7, wherein the table predefines the eccentric offset of the optically non-resolvable auxiliary structures at least in a manner dependent on structure widths of the respective two mask structures and a distance between the respective two mask structures.

9. The method as claimed in claim 1, wherein the optically non-resolvable auxiliary structures are positioned with the aid of a simulation program.

10. The method as claimed in claim 1, wherein strips oriented perpendicularly to respectively assigned mask structures are added as the optically non-resolvable auxiliary structures.

11. The method as claimed in claim 10, wherein the perpendicular strips are arranged in groups between the respectively assigned mask structures.

12. The method as claimed in claim 1, wherein the optically non-resolvable auxiliary structures have a width that is chosen in a manner dependent on a distance between the two mask structures and/or structure widths of the two mask structures.

13. The method as claimed in claim 1, wherein a model-based OPC method or a rule-based OPC method is carried out as the OPC method.

14. The method as claimed in claim 1, wherein a modified arrangement of the optically non-resolvable auxiliary structures is performed in the case of contact holes.

15. The method as claimed in claim 14, wherein adjacent optically non-resolvable auxiliary structures are connected to one another to form a communal structure in the case of contact holes.

16. The method as claimed in claim 1, wherein:
   before or after the positioning of the optically non-resolvable auxiliary structures, the mask structures are firstly enlarged or reduced in size to form altered mask structures in accordance with a predetermined set of rules, and the altered mask structures are then supplemented by the optically non-resolvable auxiliary structures.

17. The method as claimed in claim 16, wherein the set of rules is stored in the form of a set of rules table and the extent of size enlargement or reduction of the mask structures of the provisional auxiliary mask layout is read from the set of rules table for each of the mask structures.

18. The method as claimed in claim 17, wherein a discretization of the set of rules table is identical to a discretization of the grid structure used in the OPC method or twice as large as the discretization of the grid structure used in the OPC method.

19. The method as claimed in claim 17, wherein the set of rules is stored in a mathematical function and the extent of size enlargement or reduction of the mask structures of the provisional auxiliary mask layout is calculated for each of the mask structures with the aid of the mathematical function.

20. The method as claimed in claim 16, wherein the set of rules defines the extent of size enlargement or reduction of the mask structures of the provisional auxiliary mask layout in two-dimensional form.

21. The method as claimed in claim 16, wherein the set of rules takes account of mask structures having dimensions in a CD range separately by defining CD classes with, in each case, a minimum and maximum structure size, and wherein an identical set of rules is employed within each CD class.

22. The method as claimed in claim 16, wherein the set of rules provides additional rules for line ends and contact holes, such that line ends or contact holes are lengthened or shortened or rounded or serif-like structures or hammerheads are added.

23. The method as claimed in claim 16, wherein the set of rules deals differently with mask structures that represent wirings and mask structures that define a gate or a gate length, by virtue of the fact that different sets of rules are employed in each case therefor.

24. The method as claimed in claim 16, wherein, in addition to a CD value, the distance between the main structures of the provisional auxiliary mask layout is also taken into account with the set of rules by virtue of the use of a two-dimensional bias matrix, that is to say a bias matrix dependent on the CD value and on the distance.

25. The method as claimed in claim 16, wherein the application of the set of rules is carried out by means of a data processing system.

26. The method as claimed in claim 1, wherein at least two different OPC variants are used in the context of the OPC method in that:

the provisional auxiliary mask layout is subdivided into at least two layout regions, and each of the layout regions is processed according to one of the at least two OPC variants.

27. The method as claimed in claim 26, wherein the OPC method comprises a process window OPC variant and/or a target OPC variant.

28. The method as claimed in claim 27, wherein the provisional auxiliary mask layout is subdivided into at least one layout region with at least one active structure, and into at least one layout region with at least one passive structure.

29. The method as claimed in claim 28, wherein the at least one layout region with the at least one active structure is subjected to the target OPC variant, and the at least one layout region with the at least one passive structure is subjected to a process window OPC variant.

30. The method as claimed in claim 29, wherein gate structures are treated as the active structures.

31. The method as claimed in claim 26, wherein the OPC method comprises a defocus OPC variant and wherein a model-based OPC variant is carried out as the process window OPC variant.

32. The method as claimed in claim 26, wherein the OPC method comprises a defocus OPC variant and wherein a rule-based OPC variant is carried out as the process window OPC variant.

33. The method as claimed in claim 26, wherein the OPC method comprises a target OPC variant and wherein a model-based OPC variant is carried out as the target OPC variant.

34. The method as claimed in claim 26, wherein the OPC method comprises a target OPC variant and wherein a rule-based OPC variant is carried out as the target OPC variant.

35. The method as claimed in claim 1, wherein layout regions with optically resolvable auxiliary structures are subjected to a different OPC variant than layout regions without the optically non-resolvable auxiliary structures.

36. The method as claimed in claim 1, wherein firstly layout regions with gate structures are supplemented with optically non-resolvable auxiliary structures.

37. The method as claimed in claim 1, wherein exclusively layout regions with gate structures are supplemented with optically non-resolvable auxiliary structures.

38. The method as claimed in claim 1, wherein it is ensured when producing the mask layout that interconnects lie exclusively above active zones for which a contact connection is to be achieved.

39. The method as claimed in claim 38, wherein it is ensured when producing the mask layout that interconnects lie exclusively above those gate structures for which a contact connection of the gate is to be achieved.

40. The method as claimed in claim 1, wherein it is ensured when producing the mask layout that wiring structures are treated such that they lie outside any active zones.

41. The method as claimed in claim 1, wherein pad structures and remaining wiring structures are treated differently when producing the mask layout.

42. The method as claimed in claim 41, wherein a target OPC variant is used when producing the mask layout for pad structures.

43. The method as claimed in claim 1, wherein the method is carried out exclusively on non-gate planes.

44. The method as claimed in claim 1, wherein CD-critical and CD-noncritical structures are subjected to different OPC variants.

45. The method as claimed in claim 1, wherein the method is used for DRAM mask layouts.

46. The method as claimed in claim 45, wherein cell array structures and cell array edge structures are processed with different OPC variants.

47. The method as claimed in claim 1, wherein electrically required mask structures and unrequired dummy structures are treated differently.

48. The method as claimed in claim 1, wherein the eccentric offset of the optically non-resolvable auxiliary structure is chosen in such a way that the optically non-resolvable auxiliary structure is shifted in the direction toward the smaller or narrower of the two mask structures.

49. The method as claimed in claim 1, further comprising:
building a mask from the final mask layout; and using the mask to fabricate a portion of an integrated circuit.

* * * * *